US009853106B2

(12) United States Patent
Yi et al.

(10) Patent No.: US 9,853,106 B2
(45) Date of Patent: Dec. 26, 2017

(54) NANO-STRUCTURE ASSEMBLY AND NANO-DEVICE COMPRISING SAME

(71) Applicant: SNU R&DB Foundation, Seoul (KR)

(72) Inventors: Gyu Chul Yi, Seoul (KR); Hong Seok Oh, Gyeonggi-do (KR)

(73) Assignee: SNU R&DB Foundation (KR)

( * ) Notice: Subject to any disclaimer, the term of this patent is extended or adjusted under 35 U.S.C. 154(b) by 0 days.

(21) Appl. No.: 14/767,961

(22) PCT Filed: Jul. 1, 2013

(86) PCT No.: PCT/KR2013/005811
§ 371 (c)(1),
(2) Date: Aug. 14, 2015

(87) PCT Pub. No.: WO2014/126300
PCT Pub. Date: Aug. 21, 2014

(65) Prior Publication Data
US 2016/0035838 A1  Feb. 4, 2016

(30) Foreign Application Priority Data

Feb. 15, 2013  (KR) ........................ 10-2013-0016393

(51) Int. Cl.
*H01L 29/772* (2006.01)
*H01L 29/20* (2006.01)
*F28D 15/02* (2006.01)
*H01L 29/06* (2006.01)
*H01L 29/15* (2006.01)
(Continued)

(52) U.S. Cl.
CPC .......... *H01L 29/2003* (2013.01); *F28D 15/02* (2013.01); *H01L 29/0676* (2013.01); *H01L 29/152* (2013.01); *H01L 29/775* (2013.01); *H01L 29/786* (2013.01); *H01L 23/373* (2013.01); *H01L 33/641* (2013.01); *H01L 2924/0002* (2013.01)

(58) Field of Classification Search
CPC ............ H01L 29/2003; H01L 29/0676; H01L 29/152; H01L 29/775
USPC ........................................ 257/9, 14
See application file for complete search history.

(56) References Cited

U.S. PATENT DOCUMENTS

| 2011/0256386 A1* | 10/2011 | Shi | ........................ | C23C 16/342 |
| | | | | 428/336 |
| 2012/0085991 A1* | 4/2012 | Cohen | .................... | B82Y 10/00 |
| | | | | 257/28 |

(Continued)

FOREIGN PATENT DOCUMENTS

| JP | 2010-253730 A | 11/2010 |
| KR | 1020070079957 A | 8/2007 |

(Continued)

OTHER PUBLICATIONS

Korean Patent Office, Office Action dated Aug. 17, 2015 against corresponding Korean Patent Application No. 10-2013-0016393 without an English translation.

*Primary Examiner* — Asok K Sarkar
*Assistant Examiner* — Dmitriy Yemelyanov
(74) *Attorney, Agent, or Firm* — Hammer & Associates, P.C.

(57) ABSTRACT

Provided are a nano-structure assembly including an insulating substrate; and a nano-structure formed on the insulating substrate, and a nano-device including the same.

11 Claims, 5 Drawing Sheets

(51) Int. Cl.
  *H01L 29/775* (2006.01)
  *H01L 29/786* (2006.01)
  *H01L 33/64* (2010.01)
  *H01L 23/373* (2006.01)

(56) References Cited

U.S. PATENT DOCUMENTS

| | | |
|---|---|---|
| 2013/0001515 A1 | 1/2013 | Li et al. |
| 2013/0022813 A1 | 1/2013 | Tang et al. |
| 2013/0292687 A1* | 11/2013 | Jiang ................ H01L 31/03048 257/76 |

FOREIGN PATENT DOCUMENTS

| | | |
|---|---|---|
| KR | 1020080030042 A | 4/2008 |
| KR | 1020120131866 A | 12/2012 |

\* cited by examiner

【FIG.1】
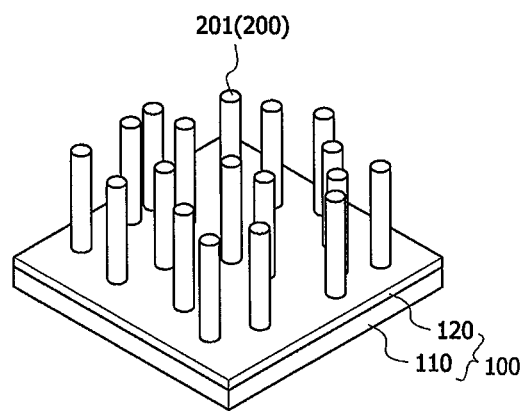
【FIG.2a】
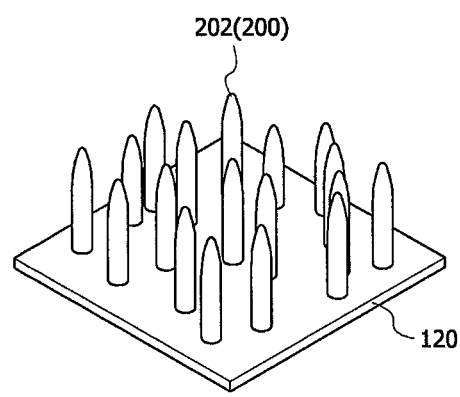

【FIG.2b】
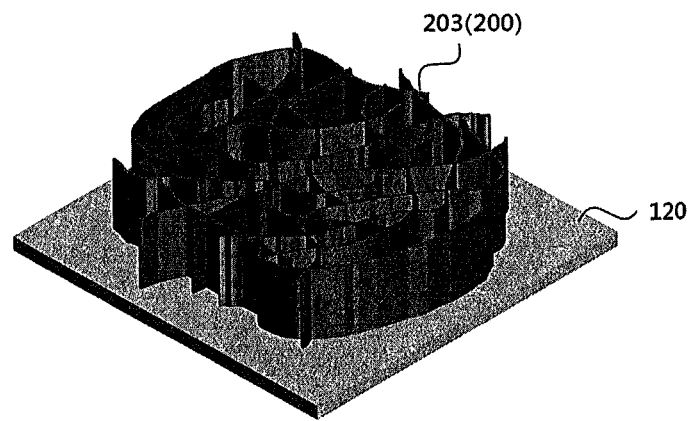
【FIG.2c】
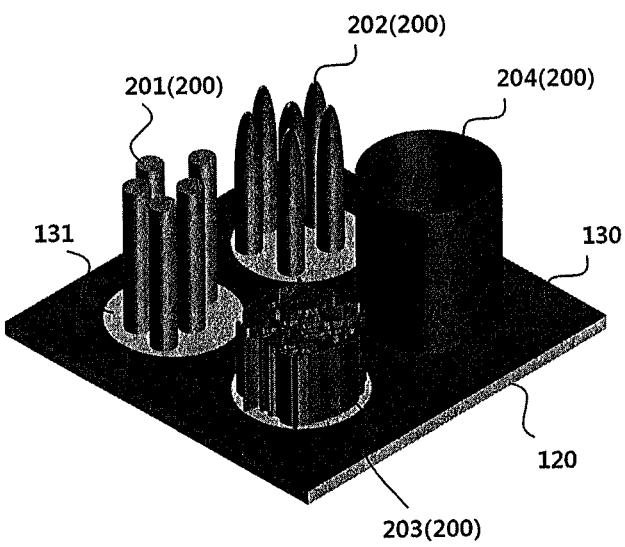

【FIG.3a】
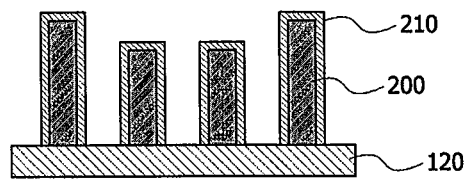
【FIG.3b】
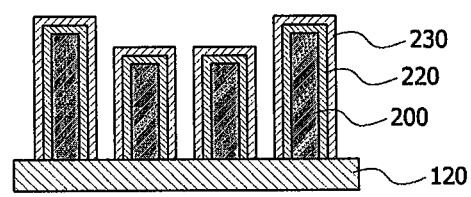
【FIG.4】
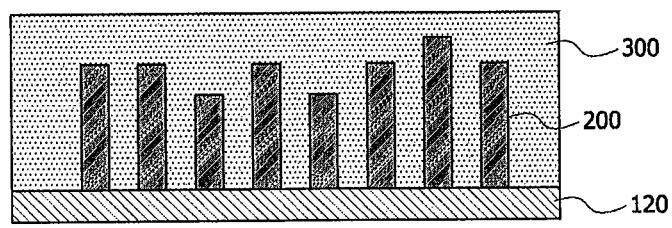

[FIG.5]
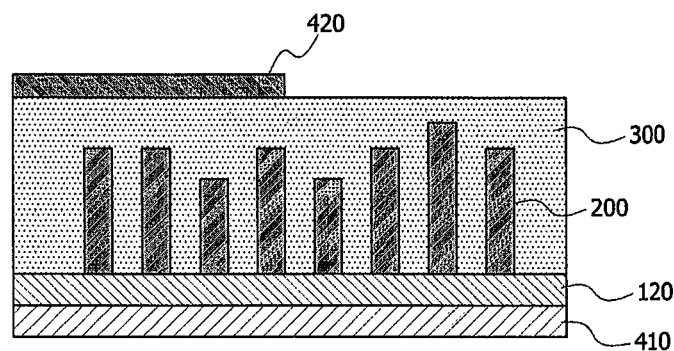
[FIG.6]
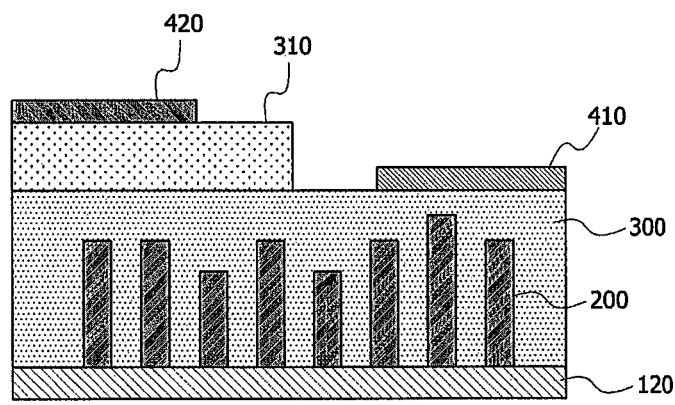

【FIG.7】
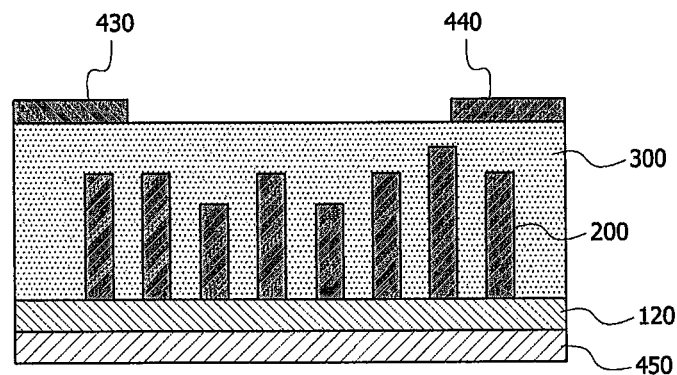
【FIG.8】
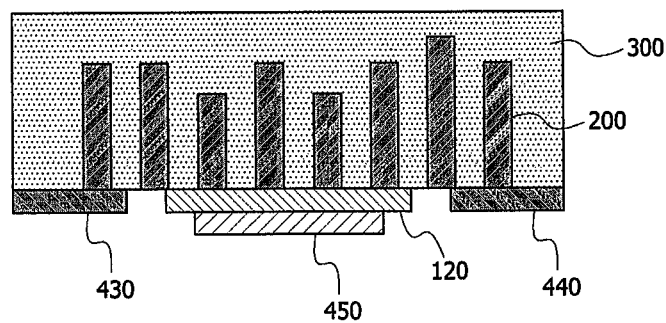

NANO-STRUCTURE ASSEMBLY AND NANO-DEVICE COMPRISING SAME

TECHNICAL FIELD

The present invention relates to a nano-structure assembly including a nano-structure grown on a hexagonal boron nitride substrate.

BACKGROUND ART

Nano-structures using semiconducting materials have been attracting attention as a material well-suited for high-performance optical devices and electronic devices, because the nano-structure can improve the properties crucial to optical and electronic devices, such as electron mobility, electron-to-hole coupling ratio, and field emission characteristics.

However, since semiconducting nanostructures are manufactured only on certain substrates such as sapphire and silicon carbide, it has a problem in providing the properties required for next-generation devices, such as flexibility and transparency.

Hexagonal boron nitride is a material having a two-dimensional structure that is composed of boron and nitrogen atoms positioned in the planar hexagonal structure. Since its structure is analogous to that of graphene, hexagonal boron nitride is sometimes called white graphene.

Similar to graphene, hexagonal boron nitride has been attracting attention as a next-generation material because it has excellent physical properties such as tensile strength, flexibility, transparency, and thermal conductivity. However, hexagonal boron nitride is different from graphene in that it is classified as an insulating material, so hexagonal boron nitride can be used instead of graphene in applications requiring insulating materials.

Therefore, semiconductor nano-structures fabricated on hexagonal boron nitride enables the addition of desirable properties, such as flexibility and transparency, to the existing high-performance optical devices and electronic devices, and thus can be useful as a base material for next-generation devices.

Also, compared to the semiconductor nano-structure grown on graphene, the electrical properties of the nano-structure fabricated on hexagonal boron nitride can be used more advantageously, owing to the insulating property of hexagonal boron nitride.

However, there hasn't been much research conducted by far on the subject of growing semiconductor nano-structure on hexagonal boron nitride.

DISCLOSURE

Technical Problem

The present invention provides a nano-structure assembly in which a nano-structure is formed on a hexagonal boron nitride substrate.

Also, the present invention provides a nano-device including a nanostructure.

Technical Solution

According to one aspect of the present invention, a nano-structure assembly includes an insulating substrate; and a nano-structure formed on the insulating substrate.

In the nano-structure assembly according to one aspect of the present invention, the insulating substrate may include hexagonal boron nitride (h-BN).

In the nano-structure assembly according to one aspect of the present invention, the nano-structure may be at least one selected from the group consisting of nanorods, nanoneedles, nanotubes, nanoflower, and nanowalls, which are formed on the insulating substrate.

In the nano-structure assembly according to one aspect of the present invention, the nano-structure is at least one selected from the group consisting of oxides, such as ZnO, $TiO_2$, $Al_2O_3$ $SnO_2$, $SiO_2$, $In_2O_3$, CdO, MgO, CaO, SrO, BaO, NiO, $Cu_2O$, and CuO; nitrides, such as GaN, InGaN, AlGaN; carbides such as SiC; and □-□ and □-□ group compounds such as GaAs, GaP, InP, GaInP or AlGaAs.

In the nano-structure assembly according to one aspect of the present invention, the nano-structure may include a coating layer formed on a surface of the nanostructure.

In the nano-structure assembly according to one aspect of the present invention, a junction of the coating layer and the nanostructures may be formed in the structure of quantum wells.

In the nano-structure assembly according to one aspect of the present invention, a thin film layer covering the nano-structure may be formed.

In the nano-structure assembly according to one aspect of the present invention, the thin film layer may have a composition identical to or different from a composition of the nano structure.

A nano-device according to one aspect of the present invention includes an insulating substrate; a nano-structure grown on one surface of the insulating substrate; a source electrode and a drain electrode, formed above the nanostructure; and a gate electrode formed on the other surface of the insulating substrate.

A nano-device according to another aspect of the present invention includes an insulating substrate; a nano-structure grown on one surface of the insulating substrate; and a source electrode, a drain electrode and a gate electrode, formed on the insulating substrate, wherein a part of the insulating substrate corresponding to the drain electrode and the source electrode is etched.

The nano-device according to one aspect of the present invention may include a thin film layer covering the nano-structure.

In the nano-device according to one aspect of the present invention, the thin film layer may have a composition identical to or different from a composition of the nano-structure.

Advantageous Effects

According to the present invention, the nano-structures formed on a hexagonal boron nitride substrate can be used in a wide array of applications requiring flexibility and transparency, such as for optical and electronic devices.

Also, since hexagonal boron nitride has high electrical insulating and heat radiating properties, it can be utilized in applications involving various optical and electronic devices requiring such properties.

DESCRIPTION OF DRAWINGS

FIG. 1 is a conceptual diagram of a nano-structure assembly according to an embodiment of the present invention, FIGS. 2a, 2b and 2c are diagrams showing various shapes of a nano-structure according to an embodiment of the present invention, FIGS. 3a and 3b are diagrams showing various shapes of a coating layer formed on the nano-structure according to an embodiment of the present invention, FIG. 4 is a conceptual diagram showing the state in which the thin film layer is formed on the nano-structure assembly according to an embodiment of the present invention, FIG. 5 is a conceptual diagram of a nano-device according to an embodiment of the present invention, FIG. 6 illustrates a modification of the nano-device according to an embodiment of the present invention, FIG. 7 is a conceptual diagram of a nano-device according to another embodiment of the present invention, FIG. 8 is a modification of the nano-device according to another embodiment of the present invention.

MODES OF THE INVENTION

Since the present invention may have various modifications and embodiments, some exemplary embodiments are shown in the drawings and will be described in further detail.

It should be understood, however, that there is no intent to limit exemplary embodiments to the particular forms disclosed, but to the contrary, exemplary embodiments are to cover all modifications, equivalents, and alternatives falling within the scope of the present invention.

In the embodiments described below, it is to be understood that the terms "comprise" and/or "have" as used herein specify the presence of stated features, numerals, steps, operations, components, elements or combinations thereof, but do not preclude the presence or addition of one or more other features, numerals, steps, operations, components, elements or combinations thereof.

Also, in the drawings, sizes of elements may be exaggerated or contracted for purposes of clarity and convenience of description.

Some embodiments of the present invention are described below in further detail with reference to the accompanying drawings. Those components that are the same are described using the same reference numeral throughout the drawings, and redundant descriptions thereof may not be repeated.

FIG. 1 is a conceptual diagram of a nano-structure assembly according to an embodiment of the present invention, and FIGS. 2a, 2b and 2c are diagrams showing various shapes of nano-structures according to an embodiment of the present invention.

As illustrated in FIG. 1, the nano-structure assembly according to an embodiment of the present invention includes an insulating substrate 120 and a nano-structure 200 formed on the insulating substrate 120.

As the insulating substrate 120, among various insulating materials, a substrate composed of boron nitride may be selected.

Boron nitrides can be broadly categorized into two types, hexagonal boron nitride (hBN) and cubic boron nitride (cBN). Of the two, hexagonal boron nitride (h-BN) has a layered structure similar to graphite, and excellent transparency, thermal stability, electrical insulating property, thermal conductivity and heat radiating property. Hereinafter, it will be discussed with a hexagonal boron nitride substrate as the insulating substrate.

The hexagonal boron nitride substrate 120 can be manufactured by being formed on a separate growth substrate 110 and then peeled off. More specifically, the hexagonal boron nitride substrate 120 may be manufactured by flowing a boron (B) source and a nitride (N) source into a chamber in which a nickel (Ni) or copper (Cu) substrate is deposited. Here, a small amount of vapor may be flowed into the chamber to prevent carbon contamination.

Also, the thickness of the hexagonal boron nitride substrate 120 is preferably in the range of 0.35 nm to 100 nm. With the thickness less than 0.35 nm, it is difficult to secure sufficient strength, whereas the thickness greater than 100 nm leads to undesirable opacity in the substrate.

Sheet resistance of the hexagonal boron nitride substrate 120 is preferably 1 GΩ/□ or greater. With the surface resistance below 1 GΩ/□, the hexagonal boron nitride substrate may undesirably act as a channel for leakage current.

The nano-structure 200 grows on the hexagonal boron nitride substrate 120 in practically a vertical direction. These nano-structures 200 can be formed by chemical vapor deposition (CVD) including metalorganic chemical vapor deposition (MOCVD), sputtering, thermal or electron beam evaporation, pulse laser deposition (PLD), or molecular beam epitaxy (MBE).

The nano-structure 200 may include at least one selected from the group consisting of oxides, such as ZnO, $TiO_2$, $Al_2O_3$ $SnO_2$, $SiO_2$, $In_2O_3$, CdO, MgO, CaO, SrO, BaO, NiO, $Cu_2O$, and CuO; nitrides, such as GaN, InGaN, AlGaN; carbides such as SiC; and □-□ and □-□ group compounds such as GaAs, GaP, InP, GaInP or AlGaAs.

Although the nano-structure 200 illustrated in FIG. 1 is in the shape of nanorods 202 grown on the hexagonal boron nitride substrate 120, the nano-structure 200 may be embodied in other shapes such as nanoneedles 202 as depicted in FIG. 2a or nanowalls 202 as depicted in FIG. 2b. Other known shapes of nano-structures (nanotubes, nanoflowers, etc.) are also viable.

Also, as illustrated in FIG. 2c, with a masking layer 130 formed on the hexagonal boron nitride substrate 120 and a plurality of openings 131 formed on the masking layer 130, nano-structures in various shapes such as nanoneedles 202, nanowalls 203, nanotubes 204 can be formed. Here, the shape of the openings 131 can be variously modified in consideration of the density, arrangement and shapes of the nano-structures, and the distance between the openings 131 may be in the range of 1 nm to 1000 nm.

The diameter or thickness of the nano-structure 200 may be in the range of 10 nm to 100 um, and the height of the nano-structure 200 may be in the range of 10 nm to 100 um. Also, the ratio of length to diameter of the nano-structure 200 may range from 1 to 1000. However, these figures may vary depending on the type of a nano-structure, the form of a nano-device, and their characteristics.

As illustrated in FIG. 1, and FIGS. 2a, 2b and 2c, the nano-structures 200 are disposed apart from each other on the hexagonal boron nitride substrate 120, but the density of the nano-structures 200 can be suitably adjusted.

FIGS. 3a and 3b are diagrams showing various shapes of the coating layer formed on the nano-structure according to an embodiment of the present invention.

As illustrated in FIG. 3, various types of the coating layer 210 may be formed on the nano-structure 200. The coating layer 210 may be formed to a thickness in the range of 0.1 nm to 100 mm. Specifically, as illustrated in FIG. 3a, the coating layer 210 may be formed of p-type semiconducting multi-layers whereas the nano-structure 200 may be formed of an n-type semiconducting material, thereby having a p-n junction. For example, the p-type and n-type can be easily prepared by a method generally known in the process of manufacturing semiconductors, such as doping with an appropriate dopant, with 3 or 5 valence electrons.

Alternatively, as shown in FIG. 3b, the first coating layer 220 may be formed of a material with a low band-gap and the second coating layer 230 may be formed of a material with a high band-gap, thereby having a quantum well structure. The energy band gap can be controlled by controlling the types of the coating layers.

For example, the first coating layer 220 may be manufactured with ZnO (bandgap: 3.27 eV) and the second coating layer may be manufactured with MgO (bandgap: 8 eV) to form a quantum well structure. The coating layers may be formed by methods such as MOCVD and sputtering. Light-emitting diodes (LED) or laser devices may be manufactured using these nanostructures.

FIG. 4 is a conceptual diagram showing the state in which a thin film layer is formed on the nano-structure assembly according to an embodiment of the present invention.

As illustrated in FIG. 4, a thin film layer 300 covering the nano-structure 200 may be formed to a predetermined thickness. The thin film layer 300 may have a composition identical to or different from a composition of the nano-structure 200.

When the thin film layer 300 has a composition identical to the nano-structure 200, it has an advantage that the formation of the thin film layer 300 is easier. That is, forming the thin film layer 300 directly on the substrate 120 causes a problem that the quality of the thin film layer is lowered. However, as disclosed in the present invention, it is far easier to form the thin film layer 300 on the nano-structure 200 that is already present with a certain height and in a certain density.

FIG. 5 is a conceptual diagram of a nano-device according to an embodiment of the present invention, and FIG. 6 illustrates a modification of the nano-device according to an embodiment of the present invention.

Referring to FIG. 5, the nano-device includes a hexagonal boron nitride substrate 120, a nano-structure 200 formed on one side of the hexagonal boron nitride substrate 120, a thin film layer 300 formed on the nano-structure 200, and a first electrode 410 is formed on the other surface of the hexagonal boron nitride substrate 120, a second electrode 420 is formed on the thin film layer 300. Such nano-devices may be used in applications involving various forms of optical and electrical devices.

Also, referring to FIG. 6, the nano-device according to an embodiment of the present invention includes a hexagonal boron nitride substrate 120, a nano-structure 200 formed on one side of the hexagonal boron nitride substrate 120, a first thin film layer 300 formed on the nano-structure 200, and a second thin film layer 310 formed on the first thin film layer 300 and a first electrode 410 is formed on the first thin film layer 300 and a second electrode 420 is formed on the second thin film layer 300.

Here, the first thin film layer 300 may be an n-type semiconducting layer and the second thin film layer 310 may be a p-type semiconducting layer. Also, a part of the second thin film layer 310 may be mesa-etched so that the first electrode 410 may be formed on the first thin film layer 300. Here, an active layer (not depicted) may be included between the first thin film layer 310 and the second thin film layer 320 if needed. Nano-devices having such structures described above may be light-emitting diodes (LEDs) or photoelectric conversion devices such as laser.

FIG. 7 is a conceptual diagram of a nano-device according to another embodiment of the present invention, and FIG. 8 illustrates a modification of the nano-device according to another embodiment of the present invention.

As illustrated in FIG. 7, the nano-device according to another embodiment of the present invention includes a hexagonal boron nitride substrate 120, a nano-structure 200 grown on one surface of the hexagonal boron nitride substrate 120, a thin film layer 300 formed on the nano-structure 200, a source electrode 430 and a drain electrode 440 which are formed on the thin film layer 300, and a gate electrode 450 formed on the other surface of the hexagonal boron nitride substrate 120.

Also, as illustrated in FIG. 8, the nano-device according to yet another embodiment of the present invention includes a hexagonal boron nitride substrate 120, a nano-structure 200 grown on one surface of the hexagonal boron nitride substrate 120, a thin film layer 300 formed on the nano-structure 200, and a source electrode 430, a drain electrode 440 and a gate electrode 450, which are formed on the hexagonal boron nitride substrate 120.

Here, the hexagonal boron nitride substrate 120 may be etched in a certain pattern so that the source electrode 430 and the drain electrode 440 can be in contact with the nano-structure 200 or/and the thin film layer 300.

Devices with the structures described above can act as a transistor or MOSFET. Here, the thin film layer 300 which is in contact with the source electrode 430 and the drain electrode 440 may be n-type doped. The structures described above are analogous to the structures of FET in general, however, owing to the insulating property of the hexagonal boron nitride substrate 120, a separate insulating layer (dielectric layer) is not required.

However, constitution of these devices is not limited to the above-described, and there are various viable modifications. For example, as illustrated in FIG. 7 and FIG. 8, the source electrode 430 and the drain electrode 440 may be formed directly on the nano-structure 200 without the formation of the thin film layer 300. In this case, the nano-structure may be constructed with a certain density in order to act as a semiconducting layer.

While the present invention has been described with reference to exemplary embodiments, it will be understood by those skilled in the art that many modifications and variations can be made without departing from the scope of the appended claims and the spirit of the present invention.

DESCRIPTION OF SYMBOLS

120: hexagonal boron nitride substrate
200: nano-structure
300: thin film layer
The invention claimed is:
1. A nano-structure assembly comprising:
an insulating substrate; and
a plurality of nano-structures directly disposed on the insulating substrate; and
a semiconductor layer covering the plurality of nano-structures,
wherein the insulating substrate includes hexagonal boron nitride (h-BN),
wherein the plurality of nano-structures includes a semiconductor,
wherein the insulating substrate has a thickness in the range of 0.35 nm to 100 nm and a sheet resistance in the range of 1 G$\Omega$/□ or greater,
wherein a length of the plurality of nano-structures is larger than the thickness of the plurality of nano-structures, wherein the plurality of nano-structures is embedded in the semiconductor layer.

2. The nano-structure assembly according to claim 1 wherein a ratio of length to diameter of the nano-structure is in a range of 1 to 1000.

3. The nano-structure assembly according to claim 1 wherein the plurality of nano-structures includes at least one selected from the group consisting of nanorods, nanoneedles, nanotubes, nanoflowers and nanowalls disposed on the insulating substrate.

4. The nano-structure assembly according to claim 2 wherein the plurality of nano-structures includes at least one selected from the oxide group comprising ZnO, $TiO_2$, $Al_2O_3$, $SnO_2$, $SiO_2$, $In_2O_3$, CdO, MgO, CaO, SrO, BaO, NiO, $Cu_2O$, and CuO; the nitride group comprising GaN, InGaN, AlGaN; the carbide group comprising SiC; and the III-V group or the II-VI group compounds comprising GaAs, GaP, InP, GaInP and AlGaAs.

5. The nano-structure assembly according to claim 2 comprising a coating layer disposed on a surface of the plurality of nanostructures.

6. The nano-structure assembly according to claim 5, wherein the coating layer includes a plurality of junctions with the nano-structure.

7. The nano-structure assembly according to claim 1 wherein the semiconductor layer includes a composition identical to or different from a composition of the plurality of nanostructures.

8. A nano-device comprising:
an insulating substrate;
a plurality of nano-structures disposed on one surface of the insulating substrate;
a semiconductor layer covering the plurality of nano-structures,
a source electrode and a drain electrode, disposed on the semiconductor layer; and
a gate electrode disposed on the other surface of the insulating substrate,
wherein the insulating substrate includes hexagonal boron nitride (h-BN),
wherein the insulating substrate has a thickness in the range of 0.35 nm to 100 nm and a sheet resistance in the range of 1 G$\Omega$/□ or greater,
wherein a length of the plurality of nano-structures is larger than the thickness of the plurality of nano-structures,
wherein the plurality of nano-structures is embedded in the semiconductor layer.

9. A nano-device comprising:
an insulating substrate;
a plurality of nano-structures disposed on one surface of the insulating substrate;
a semiconductor layer covering the plurality of nano-structures; and
a source electrode, a drain electrode and a gate electrode which are disposed on the insulating substrate,
wherein a part of the insulating substrate corresponding to the source electrode and the drain electrode is etched,
wherein the insulating substrate includes hexagonal boron nitride (h-BN),
wherein the insulating substrate has a thickness in the range of 0.35 nm to 100 nm and a sheet resistance in the range of 1 G$\Omega$/□ or greater,
wherein a length of the plurality of nano-structures is larger than the thickness of the plurality of nano-structures,
wherein the plurality of nano-structures is embedded in the semiconductor layer.

10. The nano-device according to claim 8 wherein the semiconductor layer has a composition identical to or different from a composition of the plurality of nano-structures.

11. The nano-device according to claim 9 wherein the semiconductor layer has a composition identical to or different from a composition of the plurality of nano-structures.

* * * * *